(12) United States Patent
Kolla et al.

(10) Patent No.: US 11,879,936 B1
(45) Date of Patent: Jan. 23, 2024

(54) ON-DIE CLOCK PERIOD JITTER AND DUTY CYCLE ANALYZER

(71) Applicant: Ampere Computing LLC, Santa Clara, CA (US)

(72) Inventors: Yeshwant Kolla, Wake Forest, NC (US); Ashish Akhilesh, Saratoga, CA (US)

(73) Assignee: Ampere Computing LLC, Santa Clara, CA (US)

( * ) Notice: Subject to any disclaimer, the term of this patent is extended or adjusted under 35 U.S.C. 154(b) by 27 days.

(21) Appl. No.: 17/810,552

(22) Filed: Jul. 1, 2022

(51) Int. Cl.
  *G01R 31/317* (2006.01)
  *G01R 31/3185* (2006.01)

(52) U.S. Cl.
  CPC . *G01R 31/31709* (2013.01); *G01R 31/31725* (2013.01); *G01R 31/318525* (2013.01)

(58) Field of Classification Search
  CPC ........ G01R 31/31709; G01R 31/31725; G01R 31/318525
  See application file for complete search history.

(56) References Cited

U.S. PATENT DOCUMENTS

| | | | | |
|---|---|---|---|---|
| 2009/0039867 | A1* | 2/2009 | Saint-Laurent | ....... G04F 10/005 324/102 |
| 2010/0283480 | A1* | 11/2010 | Nagatani | .......... G01R 31/31709 324/555 |

* cited by examiner

*Primary Examiner* — Vineeta S Panwalkar
(74) *Attorney, Agent, or Firm* — Muncy, Geissler, Olds & Lowe, P.C

(57) ABSTRACT

Methods and systems for on-die measuring jitter of a clock under test are presented. In an aspect, an apparatus comprises a delay line having a plurality of delay elements, the outputs of which are sampled at the expected transition time of the clock under test. The sampled outputs are provided to an edge detector that indicates the presence of the clock transition at a specific time, and a latching circuit stores a record of all the edge locations seen during a sampling window. In some aspects, a counting circuit counts and stores how many times the transition occurs at each specific time during the sampling window. The counts stored by the counting circuit provide histogram data that can be analyzed to determine the jitter characteristics of the clock under test.

19 Claims, 8 Drawing Sheets

US 11,879,936 B1

ON-DIE CLOCK PERIOD JITTER AND DUTY CYCLE ANALYZER

BACKGROUND

I. Field of the Disclosure

Aspects of the disclosure relate generally to techniques for evaluating and debugging system-on-chip (SoC) design and performance.

II. Background

System-on-chip (SoC) devices conventionally comprise multiple functions on a single die or on a single package containing multiple dies. Conventionally, one or more reference clocks are provided to multiple functional blocks, which may be distributed across separate chiplets or dies. Reference clocks provide a timing reference so that the various components within the SoC are synchronized to each other, which enables high-speed communication between these components, among other benefits.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, an apparatus for measuring jitter of a clock under test having a frequency includes: a delay line comprising a plurality of fixed-delay elements connected in series to a delay line input; a clock divider circuit for providing, to the delay line input, the clock under test with the frequency divided by two; an adjustable delay circuit that provides a latch signal comprising the clock under test, delayed according to a programmed delay; a first plurality of clocked latches that use the latch signal to substantially simultaneously latch outputs of each of at least a subset of the plurality of fixed-delay elements; an edge detector circuit that detects a location in a time domain of a transition of the clock under test based on the outputs of the first plurality of clocked latches and indicates the location in the time domain of the transition of the clock under test by setting a corresponding one of a plurality of edge detector output signals to an active state and setting the other of the plurality of edge detector output signals to an inactive state; and a second plurality of latches for latching the plurality of edge detector output signals, each latch being set when the corresponding one of the plurality of edge detector output signals goes to the active state. In some aspects, the apparatus may include a counter circuit, coupled to the plurality of edge detector output signals, that counts how many times, over a specified sampling time window, the transition of the clock under test occurs in each location in the time domain corresponding to each of the plurality of edge detector outputs.

In an aspect, a method of measuring jitter of a clock under test having a frequency includes, for a duration of a sampling time window: providing, as an input to a delay line comprising a plurality of fixed-delay elements connected in series, the clock under test with the frequency divided by two; providing, as a latching signal to each of a first plurality of clocked latches that use the latching signal to substantially simultaneously latch outputs of each of at least a subset of the plurality of fixed-delay elements, the clock under test, delayed according to a programmed delay; detecting locations in a time domain of transitions of the clock under test, based on the outputs of the first plurality of clocked latches, each location in the time domain detected comprising one of a plurality of locations in the time domain represented by the outputs of the first plurality of clocked latches; storing a list of each location in the time domain that a transition of the clock under test occurs; and after the duration of the sampling time window, determining a jitter of the clock under test based on the list of each location in the time domain that a transition of the clock under test occurred. In some aspects, the method may include counting how many times the transition of the clock under test occurs in each location in the time domain, and, after the duration of the sampling time window, determining a jitter of the clock under test based on how many times the transition of the clock under test occurred in each location in the time domain.

Other objects and advantages associated with the aspects disclosed herein will be apparent to those skilled in the art based on the accompanying drawings and detailed description.

BRIEF DESCRIPTION OF THE DRAWINGS

The accompanying drawings are presented to aid in the description of various aspects of the disclosure and are provided solely for illustration of the aspects and not limitation thereof.

DETAILED DESCRIPTION OF THE DRAWINGS

Figure 1:
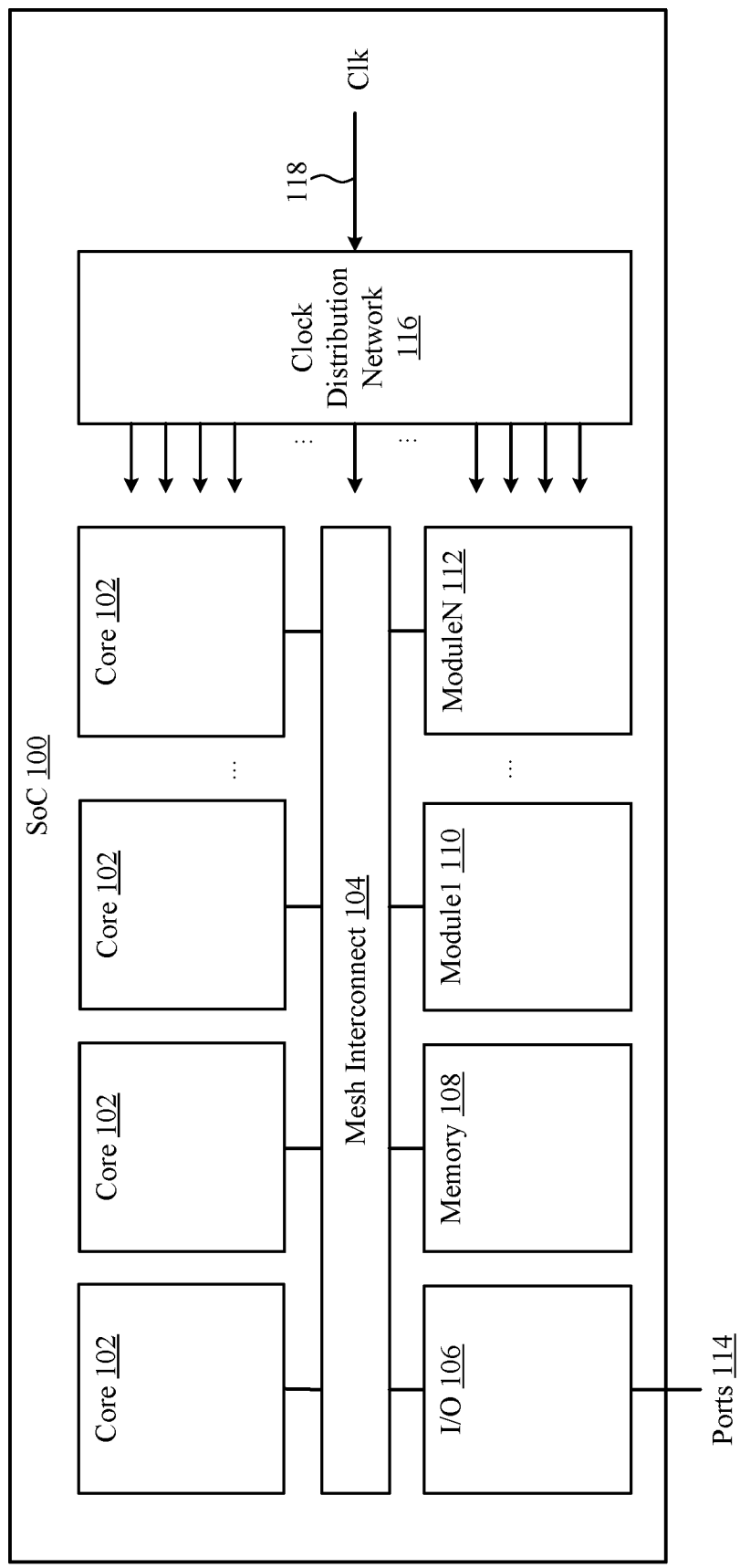
FIG. 1 is a block diagram of a conventional system on a chip (SoC)

Methods and systems for on-die measuring jitter of a clock under test are presented. In an aspect, an apparatus comprises a delay line having a plurality of delay elements, the outputs of which are sampled at the expected transition time of the clock under test. The sampled outputs are provided to an edge detector that indicates the presence of the clock transition at a specific time. A counting circuit counts and stores how many times the transition occurs at each specific time over the course of a number of samples, which may be defined by a sampling period. The counts stored by the counting circuit provide histogram data that can be analyzed to determine the jitter characteristics of the clock under test.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

The word "exemplary" is used herein to mean "serving as an example, instance, or illustration." Any implementation described herein as "exemplary" is not necessarily to be construed as preferred or advantageous over other embodiments. Likewise, the term "implementation" does not require that all implementations include the discussed feature, advantage, or mode of operation.

The terminology used herein describes particular implementations only and should not be construed to limit any implementations disclosed herein. As used herein, the singular forms "a," "an," and "the" are intended to include the plural forms as well, unless the context clearly indicates otherwise. Those skilled in the art will further understand that the terms "comprises," "comprising," "includes," and/or "including," as used herein, specify the presence of stated features, integers, steps, operations, elements, and/or components, but do not preclude the presence or addition of one or more other features, integers, steps, operations, elements, components, and/or groups thereof.

FIG. 1 is a block diagram of a conventional system on a chip (SoC) 100. The conventional SoC 100 illustrated in FIG. 1 includes a set of central processing unit (CPU) cores 102. Each CPU core 102 may also be referred to herein as a processing core 102 or simply as a core 102. The SoC 100 may include more or less than the illustrated number of CPUs (e.g., 50 CPUs, 80 CPUs, or 120+ CPUs).

In the example illustrated in FIG. 1, the SoC 100 includes a mesh interconnect 104 that forms a high speed bus that couples each of the cores 102 to each other and to other on chip and off-chip resources, including higher levels of memory (e.g., a level three (L3) cache, dual data rate (DDR) memory), peripheral component interconnect express (PCIe) interfaces, inter-integrated circuit (I2C) bus connections off-chip), and other resources. Specifically, the mesh interconnect 104 may individually couple to an input/output (I/O) block 106, a memory 108, and other modules with the SoC 100, such as Module1 110 through ModuleN 112.

Example modules include, but are not limited to, a security management processor or subprocessor, a power management processor or subprocessor, an I2C interface, joint test action group (JTAG) ports, etc. The memory 108 may be on-board random access memory (RAM), read-only memory (ROM), electrically erasable programmable ROM (EEPROM), flash memory, or other types of memory. The I/O block 106 may connect over ports 114 to external systems and memory for the SoC 100, and may connect to on-board memory 108 via the mesh interconnect 104.

In the example illustrated in FIG. 1, the SoC 100 include a clock distribution network (CDN) 116, which distributes one or more clocks to the various components within the SoC 100. In the example shown in FIG. 1, the CDN 116 distributes a reference clock (CLK) 118. Although the CDN 116 is shown as a module that is distinct from each of the various components, such as the cores 102, the mesh interconnect 104, the I/O block 106, and so on, it will be understood that some portions of the CDN 116 may exist within each of the various components and some portions of the CDN 116 may exist outside of the various components. It is noted that CLK 118 may be generated by a clock circuit within the SoC 100 or it may be provided to the SoC 100 by an external source.

Reference clocks should be steady, reliable, and accurate. For example, a reference clock has a target clock frequency and target duty cycle, and an ideal reference clock has little to no jitter, since jitter can cause the clock frequency or duty cycle to vary. Variations in clock frequency or duty cycle, excessive jitter, noise, and other imperfections in the clock waveform can cause performance issues for an SoC, including failure of communication between functional components within the SoC, or even worse, transient or occasional failures within portions of the SoC with no clear cause.

As used herein, the term "period jitter" refers to the variation over time of the duration of time from one edge of the clock to the next edge of the same phase, e.g., rising edge to rising edge or falling edge to falling edge. As used herein, the term "duty cycle jitter" refers to the variation over time of the duration of time from one edge of the clock to the next edge of the opposite phase, e.g., rising edge to falling edge or falling edge to rising edge. It is noted, however, that period jitter, even without a change in the duty cycle percentage, can have effects that are equivalent to duty cycle jitter alone, because the duration of time during which the clock is high (or low) may be greater than or less than expected, which may affect circuit performance even though the duty cycle percentage was according to specifications.

Such failures are a particular problem during initial bring-up and silicon debug of SoC designs. In order to detect the cause of failures caused by a noisy or jittery reference clock, it is conventional to directly view the clock waveform itself to detect period or duty cycle problems, or to monitor the clock waveform over time to detect transient anomalies and jitter. Without this direct visibility, it is very difficult to determine whether there was a problem with the external clock source, a problem with the internal clock source, a problem with the CDN 116, a problem caused by localized noise (e.g., power supply transients caused by I/O activity, system noise caused by core activity, etc.), or combinations of the above.

Conventional approaches involve providing a clock waveform to an external pin to which dedicated test equipment is coupled, and may involve additional circuitry to access the reference clock from multiple places within the SoC's internal clock distribution network via the same output pin. These conventional approaches complicate the reference clock routing further, may add unwanted inductance, capacitance, and/or noise, and may consume what are potentially scarce output pins. In addition, the clock frequency may be reduced to a frequency that the output pin can support, which further obscures the true waveform of the internal clock, e.g., the actual period, duty cycle, and jitter of the internal clock may not be present in the divided clock that is output to the output pin. Conventional approaches also require the use of an external analyzer, which may make in situ debugging of complex silicon difficult or impossible.

Accordingly, techniques for monitoring and analyzing clock signals within the SOC to determine the quality of the clock waveform are herein presented. These techniques are especially useful during silicon bring-up, debugging, or testing.

Figure 2:
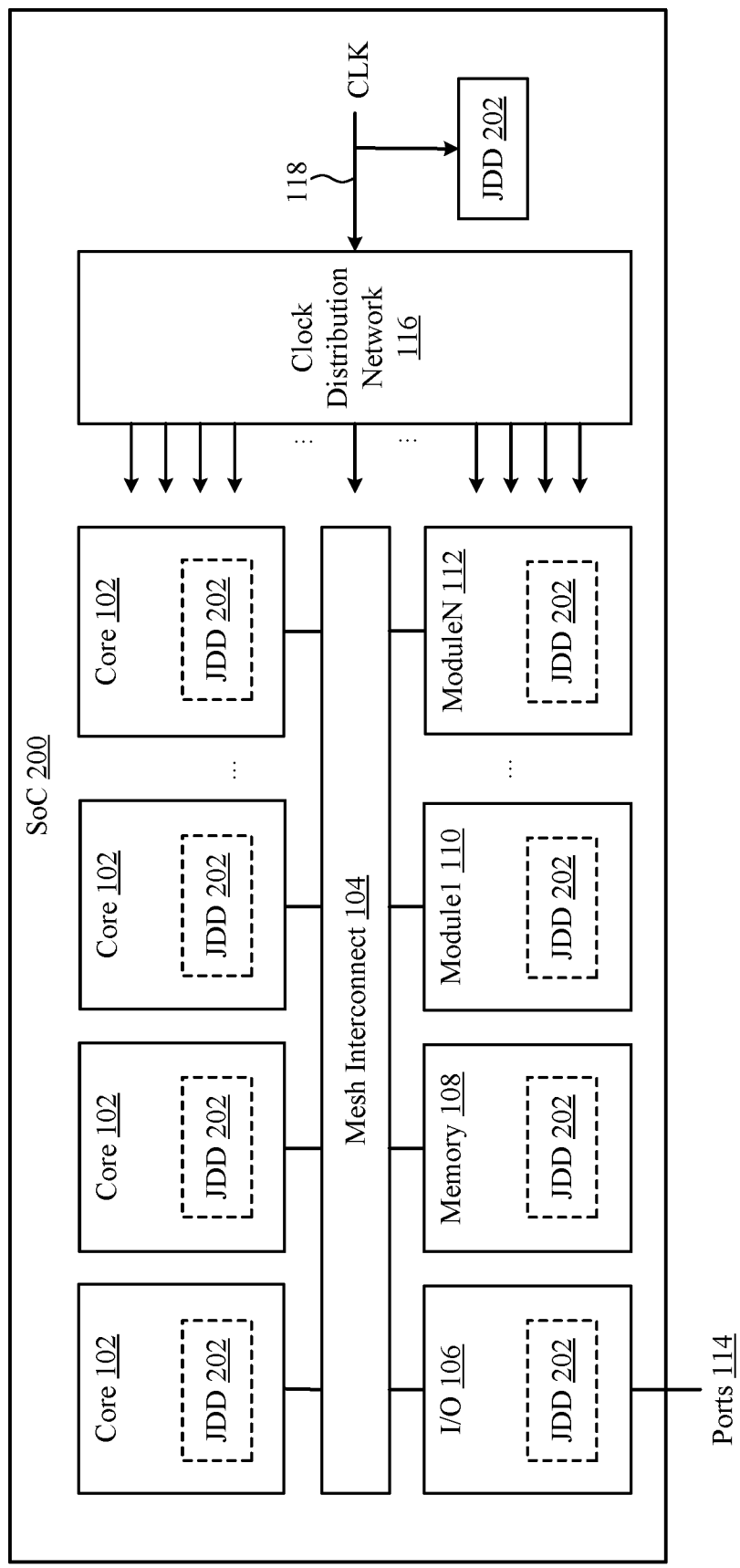
FIG. 2 is a block diagram of a SoC including a period jitter and duty-cycle detector (JDD), according to aspects of the disclosure.

FIG. 2 is a block diagram of a SoC 200 including a period jitter and duty-cycle detector (JDD) 202, according to aspects of the disclosure. In the example illustrated in FIG. 2, the SoC 200 includes cores 102, a mesh interconnect 104, an I/O block 106, a memory 108, various modules, and a CDN 116, which are substantially identical to their like-numbered equivalents in FIG. 1, and therefore the descriptions of which will not be repeated here.

At least one JDD 202 is present within the SoC 200. In the example illustrated in FIG. 2, a JDD 202 is coupled to the input of the CDN 116, e.g., to determine the health of the original reference clock CLK 118, which is particularly useful to identify problems caused by a noisy externally-provided clock source. Additional JDD 202 circuits can be included where needed. In the example shown in FIG. 2, the SoC 200 may include a JDD 202 in each of the cores 102, in the I/O block 106, in the memory 108, in some or all of the modules, in the mesh interconnect 104, or placed at various points along the paths of the CDN 116. These JDD 202 circuits are shown as optional blocks (indicated by dotted outlines) but it will be understood that JDD 202 circuits can be put anywhere. In some aspects, the JDD 202 that is attached to the CLK 118 may be omitted if not needed and a JDD 202 used elsewhere within the SoC 200. In the example shown in FIG. 2, the JDD 202 circuits monitor a single clock, but in some aspects, multiple clocks may be provided to one JDD 202, e.g., with a selector at the input to the JDD 202 to select one of the two or more clocks to be monitored by that instance of the JDD 202.

Figure 3:
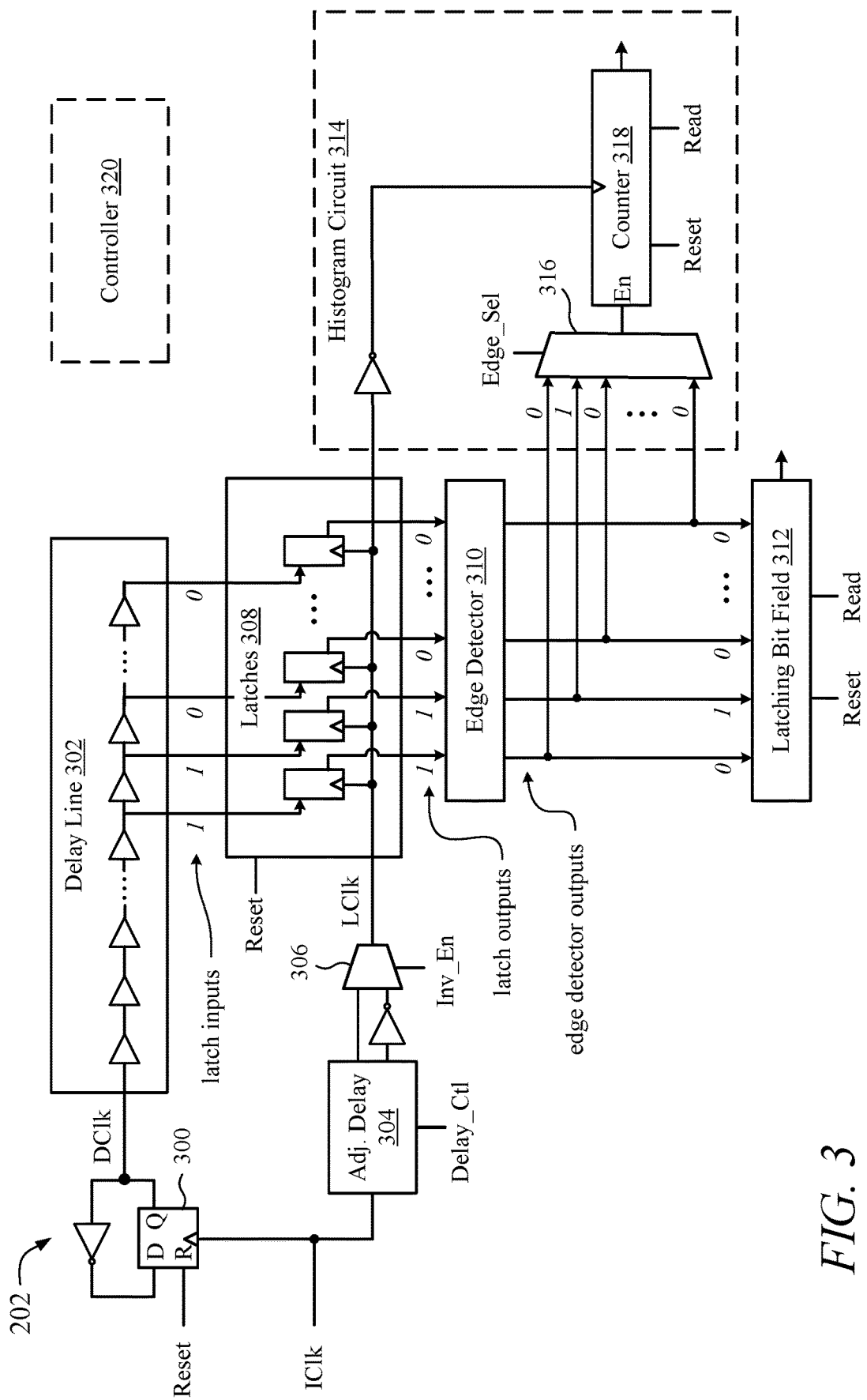
FIG. 3 is a schematic diagram of a portion of an exemplary JDD, according to aspects of the disclosure.

FIG. 3 is a schematic diagram of a portion of an exemplary JDD 202, according to aspects of the disclosure. In the example illustrated in FIG. 3, JDD 202 includes a clock divider 300 that takes an input clock (IClk) and produces a delay line clock (DClk) at half the frequency of IClk. DClk is provided to a delay line 302 comprising a series of buffers that delay a clock edge as it propagates down the delay line 302 (from left to right in FIG. 3). In some aspects, each buffer delays the signal 5 picoseconds (ps), meaning that the measurement resolution is 5 ps, but other delay values may be used, which will provide other measurement resolutions.

In the example illustrated in FIG. 3, an adjustable delay 304 and clock inverter 306 produce a latch clock (LClk) having a desired delay and phase relative to IClk. In the example illustrated in FIG. 3, the delay and phase are controlled by control signal(s) Delay_Ctl, which controls the delay, and a clock inverter control signal Inv_En, which optionally inverts the LClk. The LClk is provided as a latch signal to a set of latches 308, which sample and hold the output values of some of the buffers in the delay line 302, labeled "latch inputs" in FIG. 3. The adjustable delay 304 is used to adjust the timing of LClk such that the expected transition of DClk occurs roughly in the middle of the series of latches 308. For example, if there are 16 latches (e.g., L1 through L16), the timing of LClk is adjusted so that the expected transition of DClk occurs roughly between L8 and L9. The clock inverter allows the latches 308 to capture either the rising edge of DClk or the falling edge of DClk, depending on the value of Inv_En.

In the example illustrated in FIG. 3, the JDD 202 also includes an edge detector 310 that monitors the latch outputs and determines the location of the DClk edge. In the example illustrated in FIG. 3, the edge detector 310 will set one of the edge detector outputs to an active state (e.g., a logic "1") and the other edge detector outputs to an inactive state (e.g., a logic "0"), where the logic "1" corresponds to the location of the DClk edge within the latch outputs.

FIG. 3 illustrates an example in which a rising DClk edge is propagating from left to right through the delay line 302. In this example, the first two latches capture the DClk signal after it has gone to "1", but because the rising DClk edge has not propagated through the other buffers in the delay line 302 yet, the remaining latches capture a "0". The edge detector 310 detects that there was a transition from "0" to "1" between the second and third latch output and therefore sets the second edge detector output to "1" and sets all of the other edge detector outputs to "0".

In some aspects, the edge detector 310 may also maintain a list of edges detected, which also may be read for analysis. For example, each time one of the edge detector outputs is set to "1", the edge detector 310 may set a corresponding bit in an internal register, e.g., latching bit field 312. After all of the sampling periods have been performed, the latching bit field 312, which lists all of the edge detector outputs that went to "1" at any point during the sampling period, may be read, e.g., upon a read request, and then cleared in preparation for the next round of sampling periods. This bit field 312 will indicate the amount of jitter seen in the clock being measured, e.g., by showing the earliest and latest arrivals of the edge being measured.

As shown in FIG. 3, the JDD 202 may optionally include a histogram circuit 314 for collecting jitter histogram data. In the example illustrated in FIG. 3, the histogram circuit 314 includes an edge selector 316 that selects one of the edge detector outputs as an input to a counter 318 according to selection control(s) Edge_Sel. In this manner a single counter 318 may be multiplexed to the various edge selector outputs. In some aspects, the counter 318 will count the number of edges detected during a sampling period; after the sampling period is complete, the value of the counter 318 may be stored for later use. In the example shown in FIG. 3, a jitterless IClk will produce the same edge detector output for several clocks in a row, so counter 318 uses the selected edge detector output as an enable signal for an input clock, e.g., the inverted LClk, but other implementations are within the scope of the subject matter of the present invention. For example, in an alternative implementation, edge detector 310 may be clocked such that all of the edge detector outputs return to zero between measurements, e.g., via an inverted LClk, in which case the output of the edge selector 316 would operate as the input clock to the counter 318 rather than an enable signal.

In some aspects, the JDD 202 may include a controller 320 for performing the steps of calibration, jitter-only measurement, and jitter histogram collection. In other aspects, these steps may be controlled by an entity outside of the JDD 202.

In some aspects, the JDD 202 will monitor the IClk over a series of sampling periods, monitoring a different edge detector output during each of the different sampling periods. For example, in FIG. 3, the JDD 202 may set the edge selector 316 to provide the left most edge detector output as an input to the counter 318 for a first sampling period, after which the value from the counter 318 is stored in a first storage location, e.g., using the Read signal, and the counter 318 is then cleared, e.g., using the Reset signal. The edge selector 316 is then set to provide the next edge detector output as an input to the counter 318 for a second sampling period, after which the value from the counter 318 is stored in a second storage location, and the counter 318 is cleared. This process is repeated for each of the remaining edge detector outputs. After all of the edge detector outputs have been monitored in this manner, the counter values that were stored comprise histogram data that shows the distribution of the clock edge.

The implementation illustrated in FIG. 3 is illustrative and not limiting. For example, in FIG. 3, a single counter 318 and edge selector 316 are used to measure the number of times a particular edge detector output is set to "1" during one sample period, then measure the number of times another edge detector output is set to "1" during another sample period, and so on, but in another aspect, multiple counters 314 may be used, one for each edge detector output, in which case the edge selector 316 may be omitted. Such an embodiment would allow the clock jitter and duty cycle characteristics to be measured during a single sampling period, but at the expense of additional hardware, e.g., additional counters and read logic. Other implementations may be within the scope of the subject matter of the present disclosure.

Figure 4:
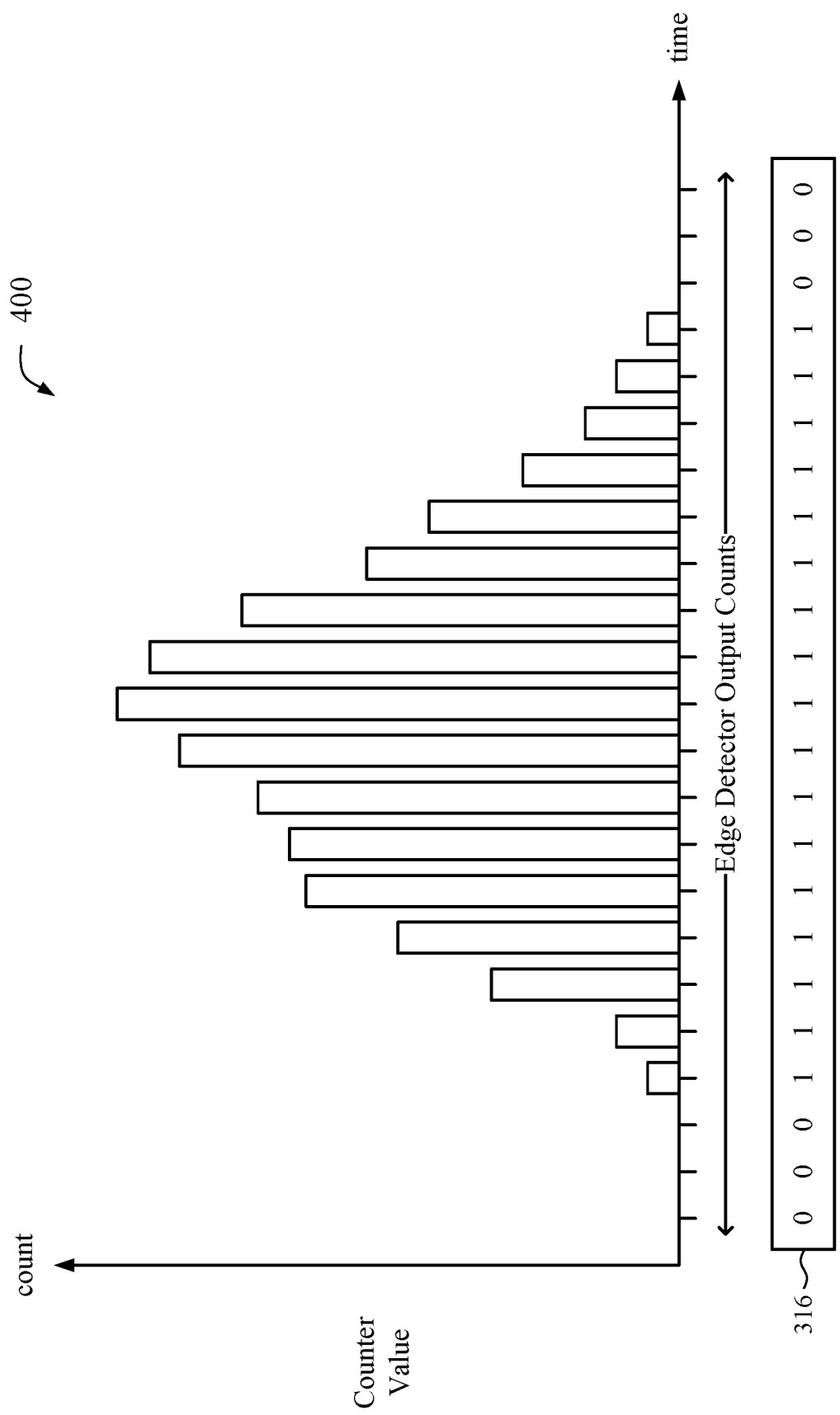
FIG. 4 illustrates an example histogram 400 produced using a JDD performing the method described above, according to aspects of the disclosure.

FIG. 4 illustrates an example histogram 400 produced using a JDD 202 performing the method described above, according to aspects of the disclosure. Each vertical bar represents the value stored in the counter 318 after a sampling period, one vertical bar for each edge detector output. FIG. 4 also illustrates an example value of the bit field 312 after the operation that produced the histogram 400. In the example histogram 400 shown in FIG. 4, some of the edge detector outputs never detected an edge, and so the height of the histogram bar for those edge detector outputs is zero, and the corresponding bit in the bit field 312 is set to "0". Since the edge detector outputs correspond to different delay line 302 buffer outputs, the histogram 400 is a histogram of the positions of the edge in the time domain, and thus the X axis represents time and the Y axis represents number of occurrences of the measured clock at each time.

Since the information illustrated by the histogram 400 is stored as a series of counter values, these values may be used to calculate characteristics of the measured clock, as shown in the following table:

TABLE 1

| Characteristic | Example calculation |
|---|---|
| Jitter Mean: | $\mu_j = \frac{1}{n} \sum_{k=1}^{n} j_k$ |
| Jitter RMS: | $\sigma^2 = \frac{1}{n-1} \sum_{k=1}^{n} ((j_k - \mu_j))^2$ |
| Jitter Peak-to-Peak: | $p_k - p_k = \max(j_k) - \min(j_k)$ |

Jitter median can be determined from either the histogram 400 or from the bit field 312, e.g., as the middle non-zero count in the histogram 400 or the middle non-zero bit in the latching bit field 312.

Figure 5:
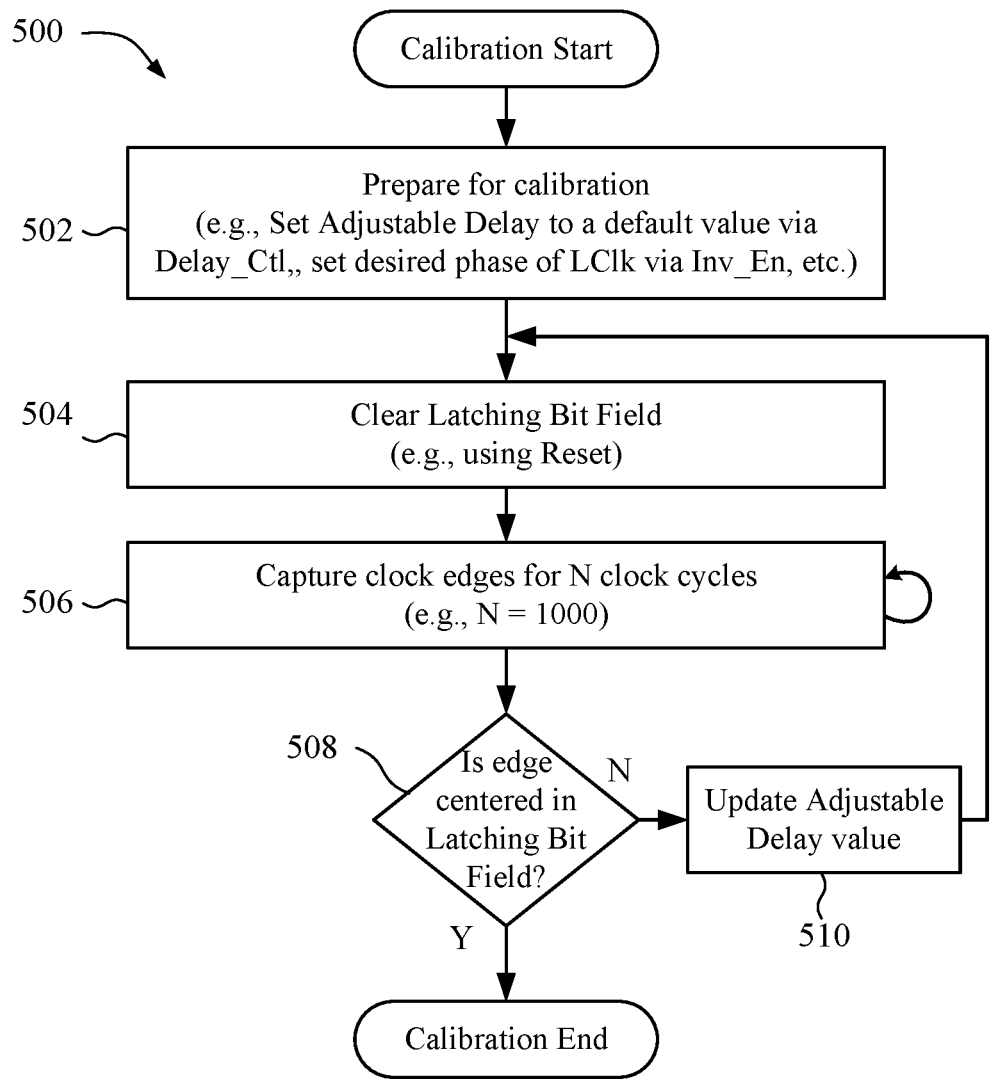
FIG. 5 is a flowchart illustrating a portion of an example calibration process 500 associated with on-die clock period jitter and duty cycle analysis, according to aspects of the disclosure.

FIG. 5 is a flowchart illustrating a portion of an example calibration process 500 associated with on-die clock period jitter and duty cycle analysis, according to aspects of the disclosure. In some aspects, one or more process blocks of FIG. 5 may be performed by a JDD 202. In some aspects, one or more process blocks of FIG. 5 may be performed by another device or a group of devices separate from or including the JDD 202, such as a SoC 200 and/or a module within the SoC 200 (e.g., a core 102, a CDN 116, etc.) The steps of the calibration process 500 will be described with respect to the example JDD 202 shown in FIG. 3.

As used herein, the term calibration refers to a process by which the value of the adjustable delay 304 is set so that the transition of DClk occurs somewhere around the middle of the row of latches 308, so that the detected edges are roughly centered within the window of time that was captured by the latching bit field 312. Centering the clock edge roughly in the middle of the window of time captured by the latching bit field 312 allows for the largest positive or negative jitter to be measured within the window of time, e.g., to ensure that the clock edge does not occur before the beginning or, or after the ending of, the window of time captured by the latching bit field 312.

In some aspects, calibration should be performed before performing a jitter measurement or generating a histogram. In some aspects, calibration should be performed in a relatively quiet environment, i.e., with as few sources of jitter-causing noise (e.g., power delivery noise, coupling, etc.) as possible. For example, during calibration it may be beneficial to disable other internal clocks, set output buffers to tri-state mode or otherwise suppress activity in order to avoid power and ground noise, disable or idle other components within the SoC, perform calibration within an environment wherein the SoC is shielded from outside electromagnetic interference, and so on.

In the embodiment shown in FIG. 5, the calibration process 500 includes, at block 502, preparing for calibration. In the JDD 202, for example, this may include one or more of setting the adjustable delay 304 to a default value via Delay_Ctl, setting a desired phase of LClk via Inv_En, etc. In some aspects, the initial value of the adjustable delay 304 may be set according to a table or other mapping of IClk frequency to initial delay value. For example, if the frequency of the clock being measured is less than 500 MHz, the adjustable delay may be set to a first initial delay value, but if the frequency of the clock being measured is 500 MHz or more, the adjustable delay may be set to a second initial value. This example is illustrative and not limiting. For example, there may be more than just the two clock frequency to initial delay mapping values described above, and the initial delay values may come from a table, or from a database, or be hardwired, and so on.

In the embodiment shown in FIG. 5, the calibration process 500 further includes, at block 504, clearing the latching bit field 312. In some aspects, this may involve asserting and de-asserting the Reset signal.

In the embodiment shown in FIG. 5, the calibration process 500 further includes, at block 506, capturing clock edges for some number (e.g., 1000) of clock cycles. In the JDD 202, for example, some number of IClk cycles are measured.

In the embodiment shown in FIG. 5, the calibration process 500 further includes determining whether the adjustable delay value should be modified, e.g., at block 508, determining if the clock edge is centered in the latching bit field 312. In the JDD 202, for example, the value of the latching bit field 312 may be read and analyzed to determine whether the detected edges are roughly centered within the window of time that was captured by the latching bit field 312. If the detected edges are grouped towards the leftmost bits of the latching bit field 312, for example, then adjustable delay may need to be shortened, and if the detected edges are grouped towards the rightmost bits of the latching bit field 312, for example, then the value of the adjustable delay may need to be lengthened.

If the adjustable delay does not need to be changed, then the calibration process ends. Otherwise, in the embodiment shown in FIG. 5, the calibration process 500 further includes, at block 510, updating the adjustable delay value.

The process then loops, starting at block 504. This continues until it is determined, at block 508, that the adjustable delay does not need to be changed.

Figure 6:
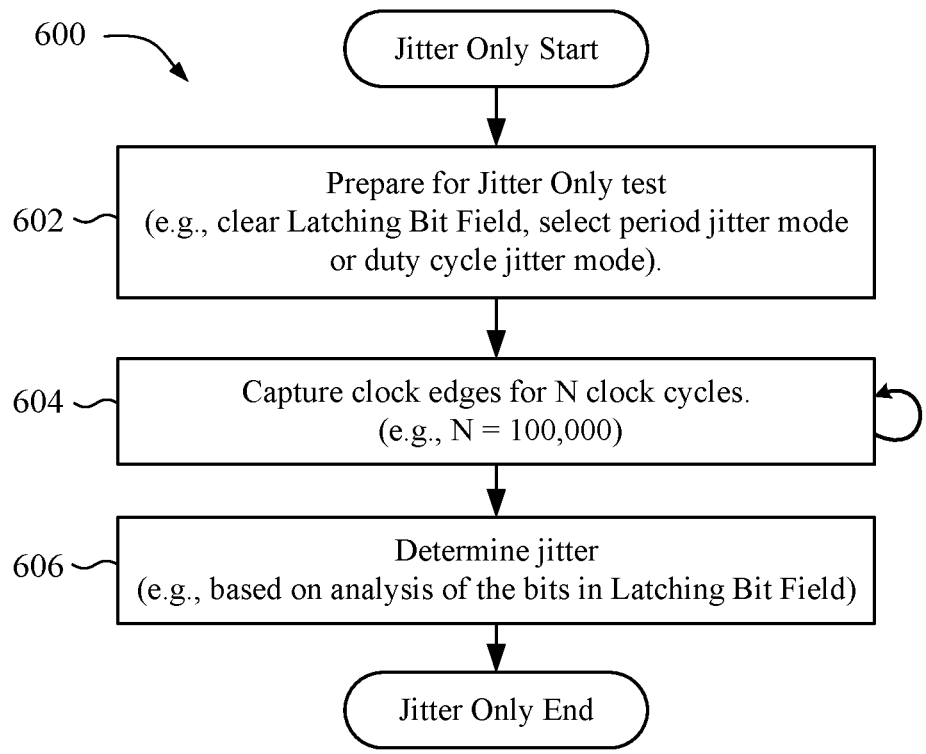
FIG. 6 is a flowchart illustrating a portion of an example jitter-only measurement process 600 associated with on-die clock period jitter and duty cycle analysis, according to aspects of the disclosure.

FIG. 6 is a flowchart illustrating a portion of an example jitter-only measurement process 600 associated with on-die clock period jitter and duty cycle analysis, according to aspects of the disclosure. In some aspects, one or more process blocks of FIG. 6 may be performed by a JDD 202. In some aspects, one or more process blocks of FIG. 6 may be performed by another device or a group of devices separate from or including the JDD 202, such as a SoC 200 and/or a module within the SoC 200 (e.g., a core 102, a CDN 116, etc.) The steps of the jitter-only measurement process 600 will be described with respect to the example JDD 202 shown in FIG. 3.

In the embodiment shown in FIG. 6, the jitter-only measurement process 600 includes, at block 602, preparing for the jitter only test, e.g., running the calibration process 500 if needed, then clearing the latching bit field 312, selecting between measuring period jitter and measuring duty cycle jitter, e.g., by setting the appropriate value of Inv_En, etc.

In the embodiment shown in FIG. 6, the jitter-only measurement process 600 further includes, at block 604, capturing clock edges for some number (e.g., 100,000) of clock cycles. In the JDD 202, for example, some number of IClk cycles are measured.

In the embodiment shown in FIG. 6, the jitter-only measurement process 600 further includes, at block 606, determining jitter. In the JDD 202, for example, the jitter can be determined based on analysis of the latching bit field 312. If only a few of the bits of the latching bit field 312 are set to "1", this indicates that the reference clock has relatively little jitter, but if many of the bits of the latching bit field 312 are set to "1", this indicates that the reference clock has relatively large jitter. In the example where the delay line 302 has a timing resolution of 5 ps, an ideal reference clock would produce a latching bit field value of "0000000010000000" (with the expected edge location underlined) but a reference clock with −15 ps to +20 ps of jitter would produce a latching bit field value of "00000111111110000". Likewise, a reference clock with −30 ps to +5 ps of jitter would produce a latching bit field value of "0011111111000000".

Figure 7:
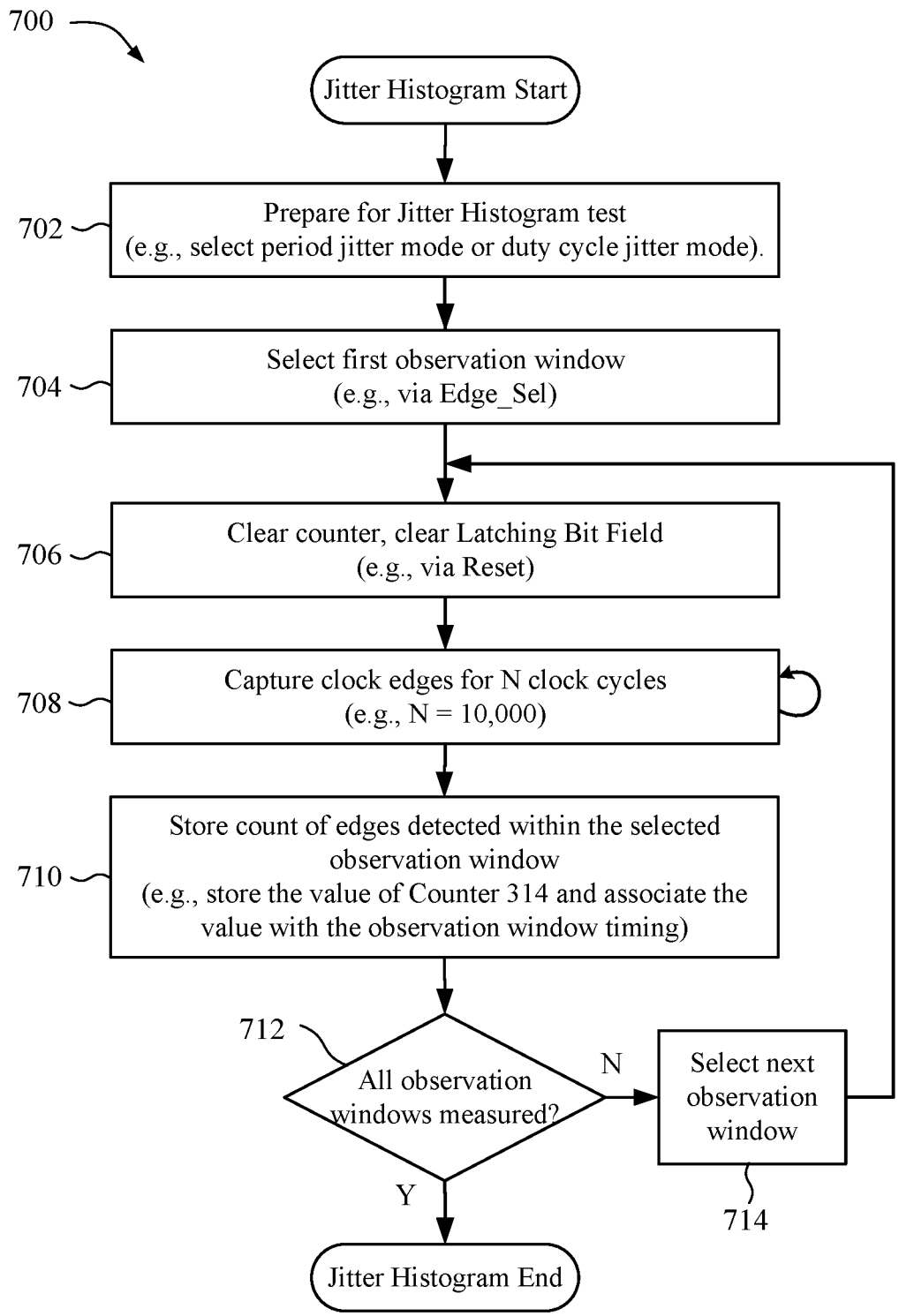
FIG. 7 is a flowchart illustrating a portion of an example jitter histogram process 700 associated with on-die clock period jitter and duty cycle analysis, according to aspects of the disclosure.

FIG. 7 is a flowchart illustrating a portion of an example jitter histogram process 700 associated with on-die clock period jitter and duty cycle analysis, according to aspects of the disclosure. In some aspects, one or more process blocks of FIG. 7 may be performed by a JDD 202. In some aspects, one or more process blocks of FIG. 7 may be performed by another device or a group of devices separate from or including the JDD 202, such as a SoC 200 and/or a module within the SoC 200 (e.g., a core 102, a CDN 116, etc.) The steps of the jitter histogram process 700 will be described with respect to the example JDD 202 shown in FIG. 3.

In the embodiment shown in FIG. 7, the jitter histogram process 700 includes, at block 702, preparing for the jitter histogram test. In the JDD 202, for example, this may include selecting between measuring period jitter and measuring duty cycle jitter, e.g., by setting the appropriate value of Inv_En.

In the embodiment shown in FIG. 7, the jitter histogram process 700 further includes, at block 704, selecting a first observation window. In the JDD 202, for example, the observation window is the window of time in which an edge will produce a "1" in the corresponding output bit of the edge detector 310, and therefore selecting an observation window involves selecting one of the edge detector outputs, e.g., via setting a value of Edge_Sel. In the following example, the first observation window will be the window of time corresponding to the leftmost edge detector output in FIG. 3, the next observation window will be the next edge detector output to the right of the previous edge detector output, and so on. In the JDD 202, the leftmost edge detector output corresponds to the earliest arrival of the clock edge and the rightmost edge detector output corresponds to the latest arrival of the clock edge.

In the embodiment shown in FIG. 7, the jitter histogram process 700 further includes, at block 706, clearing the value of the counter 318 and clearing the value of the latching bit field 312. In the JDD 202, for example, this may be done via assertion and de-assertion of the Reset signal.

In the embodiment shown in FIG. 7, the jitter histogram process 700 further includes, at block 708, capturing clock edges for some number (e.g., 10,000) of clock cycles. In the JDD 202, for example, some number of IClk cycles are measured.

In the embodiment shown in FIG. 7, the jitter histogram process 700 further includes, at block 710, storing the count of edges detected with the selected observation window. In the JDD 202, for example, the value of the counter 318 may be read and stored in a first location, e.g., that is associated with the first observation window or its timing.

In the embodiment shown in FIG. 7, the jitter histogram process 700 further includes, at block 712, determining if all observation windows have been measured. If so, then the jitter histogram process 700 ends. Otherwise, the jitter histogram process 700 further includes, at block 714, selecting the next observation window, and the process 700 loops starting from block 706, including storing the count of edges detected with the next observation window, e.g., storing the value of the counter 318 in a location that is associated with the next observation window or its timing. In this manner, the jitter histogram process 700 loops until all observation windows have been measured. At the completion of the jitter histogram process 700, the values of the counter 318 correspond to each of the observation windows can be used to generate a histogram such as the one shown in FIG. 4, and from that data, information such as jitter mean, jitter median, jitter RMS, jitter peak-to-peak, etc., may be calculated.

In some aspects, the steps shown in FIG. 7 may be repeated to measure another type of jitter, e.g., the jitter histogram process 700 may first be used to measure period jitter, then used again to measure duty cycle jitter, according to the signal Inv_En.

Figure 8:
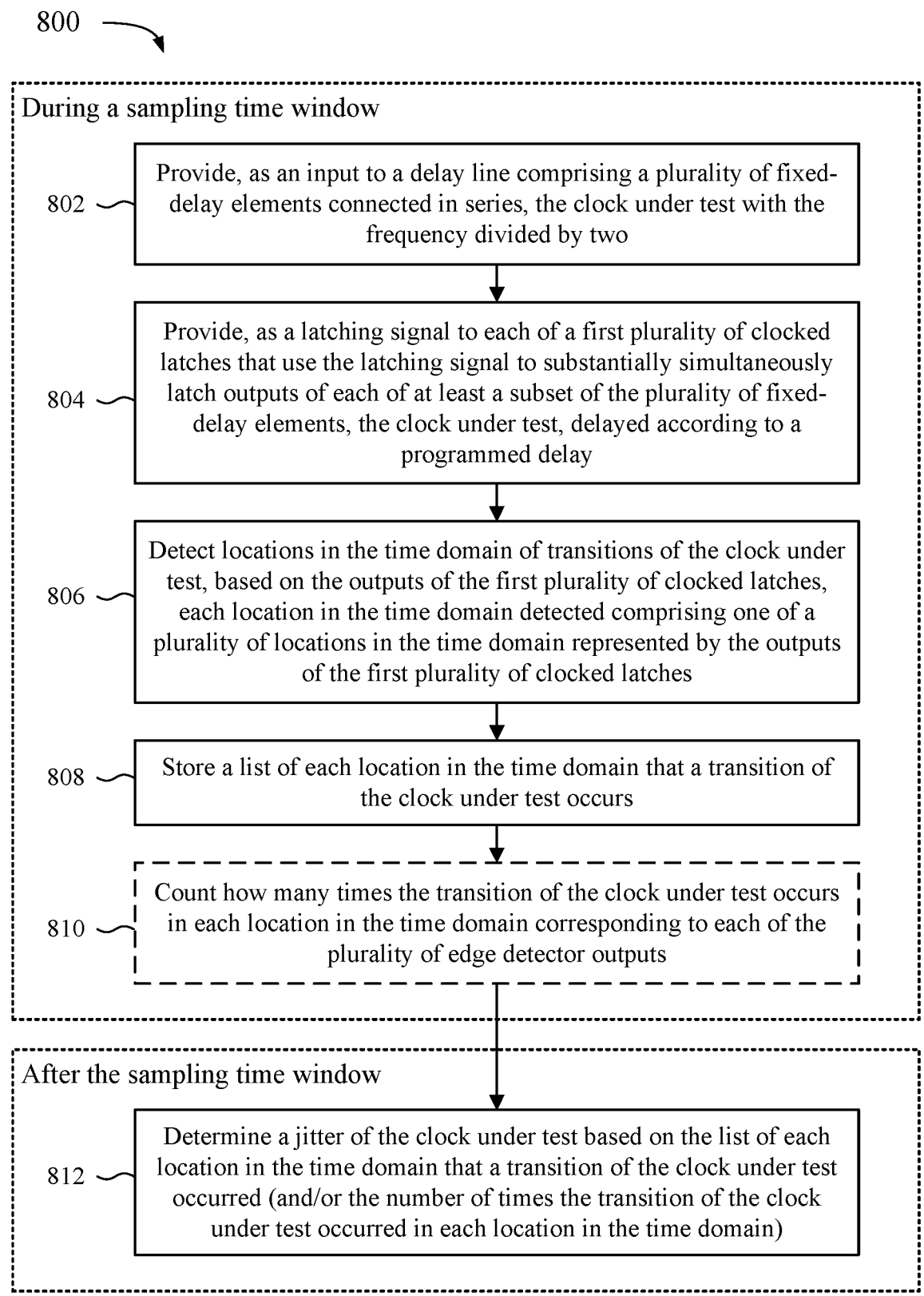
FIG. 8 is a flowchart of an example process 800 associated with on-die clock period jitter and duty cycle analyzer, according to aspects of the disclosure.

FIG. 8 is a flowchart of an example process 800 associated with on-die clock period jitter and duty cycle analyzer, according to aspects of the disclosure. In some implementations, one or more process blocks of FIG. 8 may be performed by a JDD 202. In some implementations, one or more process blocks of FIG. 8 may be performed by another device or a group of devices separate from or including the JDD 202. Additionally, or alternatively, one or more process blocks of FIG. 8 may be performed by one or more components of an apparatus, such as a processor(s), memory, or transceiver(s), any or all of which may be means for performing the operations of process 800.

As shown in FIG. 8, process 800 may include, for the duration of a sampling time window:

At block 802, providing, as an input to a delay line comprising a plurality of fixed-delay elements connected in series, the clock under test with the frequency divided by two;

At block 804, providing, as a latching signal to each of a first plurality of clocked latches that use the latching signal to substantially simultaneously latch outputs of each of at least a subset of the plurality of fixed-delay elements, the clock under test, delayed according to a programmed delay;

At block 806, detecting locations in the time domain of transitions of the clock under test, based on the outputs of the first plurality of clocked latches, each location in the time domain detected comprising one of a plurality of locations in the time domain represented by the outputs of the first plurality of clocked latches;

At block 808, storing a list of each location in the time domain that a transition of the clock under test occurs; and At optional block 810 (e.g., in aspects which include the optional histogram circuit 314), counting how many times the transition of the clock under test occurs in each location in the time domain corresponding to each of the plurality of edge detector outputs.

As further shown in FIG. 8, process 800 may include, after the duration of the sampling time window:

At block 812, determining a jitter of the clock under test based on the list of each location in the time domain that a transition of the clock under test occurred (and/or the number of times the transition of the clock under test occurred in each location in the time domain, e.g., in aspects which include the optional histogram circuit 314).

In some aspects, the sampling time window during which the operations of block 802, block 804, block 806, block 808, and block 810 are performed, comprises a plurality of sub-sampling time windows, and counting how many times the transition of the clock under test occurs in each location in the time domain corresponding to each of the plurality of edge detector outputs (block 810) comprises, for each sub-sampling time window, counting how many times the transition of the clock under test occurs in a different one of the plurality of locations in the time domain represented by the outputs of the first plurality of clocked latches.

Process 800 may include additional implementations, such as any single implementation or any combination of implementations described below and/or in connection with one or more other processes described elsewhere herein. Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

The systems and methods disclosed herein have several technical advantages over conventional techniques for measuring internal clock period and duty-cycle jitter. For example, the JDD 202 does not require a reference clock, but is instead a self-referenced design using the clock being measured. For this and other reasons, the JDD 202 can operate at a wide range of operational clock frequencies. For example, the JDD 202 has been demonstrated to measure clock period and duty-cycle jitter of clocks under test having frequencies from 100 MHz to 5 GHz with minimal hardware cost. The adjustable delay 304 allows the JDD 202 to accommodate a wide range of clock periods using minimal hardware, by adjusting the LClk so that the latches 308 are triggered at the appropriate time with regard to the period of the clock under test. That is, the adjustable delay 304 allows the latch window to be located at the correct time (i.e., at the correct place in the time domain). This process may be referred to herein as calibration of the JDD 202. In some aspects, the initial value for the delay produced by the adjustable delay 304 may be read from a table that defines initial delay values for each of multiple frequencies or frequency ranges. In some aspects, the initial delay value may be used at the start of the calibration process and that delay value adjusted during the course of calibration. In some aspects, the calibration step can be performed using the latching bit field 312 and without using the edge selector 312 or the counter 318.

In addition, because the JDD 202 is an internal circuit, the clock under test does not need to be output to an external pin, and thus avoids the disadvantages associated with routing a clock to an output pin, such as additional distortion and noise and the potential need to divide the clock before it gets to the output pin. The JDD 202 also allows for in situ jitter measurement. The JDD 202 can make these measurements over a configurable time period. The JDD 202 can provide jitter histogram data at a system clock rate much slower than the clock under test: no real-time or clock under test cycle based read or storage capability is required. The JDD 202 can provide pseudo-static read-out of data with no timing closure requirements. The JDD 202 can measure peak-to-peak, RMS, mean, and median jitter. Because the JDD 202 can measure both rising and falling edges of the clock under test, the JDD 202 can be used to measure the duty cycle and the duty cycle jitter of the clock under test.

Moreover, due to the compact design, a JDD 202 may be included in multiple locations within hardware, as illustrated in FIG. 2. For example, a JDD 202 may be included in every core or module, e.g., to monitor the quality of the reference clock that was received by the core or module. A JDD 202 may be used to monitor the reference clock (e.g., CLK 118 in FIG. 2) that was generated internally by the SoC 200 or generated externally from the SoC 200 and provided to the SoC 200. A JDD 202 may be placed at one or more places within the CDN 116, e.g., to monitor the quality at various points within the CDN 116 itself, which is particularly useful if one or more branches of the CDN 116 are subject to noise but other branches of the CDN 116 are not.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein but is to be accorded the widest scope consistent with the principles and novel features disclosed herein.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a general purpose processor, a DSP, an ASIC, an FPGA, or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods, sequences and/or algorithms described in connection with the aspects disclosed herein may be embodied directly in hardware, in a software module executed by a processor, or in a combination of the two. A software module may reside in random access memory (RAM), flash memory, read-only memory (ROM), erasable programmable ROM (EPROM), electrically erasable programmable ROM (EEPROM), registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor. The processor and the storage medium may reside in an ASIC. The ASIC may reside in a user terminal (e.g., UE). In the alternative, the processor and the storage medium may reside as discrete components in a user terminal.

In one or more example aspects, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Various components as described herein may be implemented as application specific integrated circuits (ASICs), programmable gate arrays (e.g., FPGAs), firmware, hardware, software, or a combination thereof. Further, various aspects and/or embodiments may be described in terms of sequences of actions to be performed by, for example, elements of a computing device. Those skilled in the art will recognize that various actions described herein can be performed by specific circuits (e.g., an application specific integrated circuit (ASIC)), by program instructions being executed by one or more processors, or by a combination of both. Additionally, these sequences of actions described herein can be considered to be embodied entirely within any form of non-transitory computer-readable medium having stored thereon a corresponding set of computer instructions that upon execution would cause an associated processor to perform the functionality described herein. Thus, the various aspects described herein may be embodied in a number of different forms, all of which have been contemplated to be within the scope of the claimed subject matter. In addition, for each of the aspects described herein, the corresponding form of any such aspects may be described herein as, for example, "logic configured to", "instructions that when executed perform", "computer instructions to" and/or other structural components configured to perform the described action.

Those of skill in the art will further appreciate that the various illustrative logical blocks, components, agents, IPs, modules, circuits, and algorithms described in connection with the aspects disclosed herein may be implemented as electronic hardware, instructions stored in memory or in another computer readable medium and executed by a processor or other processing device, or combinations of both. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, processors, controllers, components, agents, IPs, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium or non-transitory storage media known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. An apparatus for measuring jitter of a clock under test having a frequency, the apparatus comprising:
   a delay line comprising a plurality of fixed-delay elements connected in series to a delay line input;
   a clock divider circuit for providing, to the delay line input, the clock under test with the frequency divided by two;
   an adjustable delay circuit that provides a latch signal comprising the clock under test, delayed according to a programmed delay;
   a first plurality of clocked latches that use the latch signal to substantially simultaneously latch outputs of each of at least a subset of the plurality of fixed-delay elements;
   an edge detector circuit that detects a location in a time domain of a transition of the clock under test based on the outputs of the first plurality of clocked latches and indicates the location in the time domain of the transition of the clock under test by setting a corresponding one of a plurality of edge detector output signals to an active state and setting the other of the plurality of edge detector output signals to an inactive state; and
   a second plurality of latches for latching the plurality of edge detector output signals, each latch being set when the corresponding one of the plurality of edge detector output signals goes to the active state.

2. The apparatus of claim 1, wherein the adjustable delay circuit inverts the latch signal according to an operating mode of the adjustable delay circuit.

3. The apparatus of claim 2, wherein the operating mode of the adjustable delay circuit comprises one of a period jitter measuring mode and a duty cycle jitter measuring mode.

4. The apparatus of claim 1, wherein the plurality of edge detector output signals operate in a return-to-inactive mode or in a non-return-to-inactive mode.

5. The apparatus of claim 1, further comprising control circuitry configured to perform at least one of a calibration process or a jitter-only measurement process.

6. The apparatus of claim 5, wherein, to perform the calibration process, the control circuitry is configured to adjust the delay provided by the adjustable delay circuit until transitions of the clock under test are centered within the plurality of edge detector output signals.

7. The apparatus of claim 5, wherein, to perform the jitter-only measurement process, the control circuitry is configured to:
   clear the second plurality of latches;
   cause the clocked latches to latch a predefined number of transitions of the clock under test; and
   output the states of each of the second plurality of latches.

8. The apparatus of claim 1, further comprising a counter circuit, coupled to the plurality of edge detector output signals, that counts how many times, over a specified sampling time window, the transition of the clock under test occurs in each location in the time domain corresponding to each of the plurality of edge detector outputs.

9. The apparatus of claim 8, wherein the counter circuit comprises a single counter that is multiplexed to one of the plurality of edge detector output signals at a time, and further comprises a storage circuit for storing a plurality of counter circuit values, one value for each of the plurality of edge detector output signals.

10. The apparatus of claim 8, wherein the counter circuit comprises a plurality of counters, each coupled to a corresponding one of the plurality of edge detector output signals.

11. The apparatus of claim 8, further comprising control circuitry configured to perform a jitter-histogram process.

12. The apparatus of claim 11, wherein, to perform the jitter-histogram process, the control circuitry is configured to:
   clear the second plurality of latches;
   specify the sampling time window of the counter circuit;
   cause the clocked latches to latch transitions of the clock under test for a duration of the sampling time window of the counter circuit; and
   read, from the counter circuit, data indicating many times the transition of the clock under test occurs in each location in the time domain.

13. The apparatus of claim 12, wherein the control circuitry is further configured to display, as a histogram, the data indicating many times the transition of the clock under test occurs in each location in the time domain.

14. A method of measuring jitter of a clock under test having a frequency, the method comprising:
   for a duration of a sampling time window:
      providing, as an input to a delay line comprising a plurality of fixed-delay elements connected in series, the clock under test with the frequency divided by two;

providing, as a latching signal to each of a first plurality of clocked latches that use the latching signal to substantially simultaneously latch outputs of each of at least a subset of the plurality of fixed-delay elements, the clock under test, delayed according to a programmed delay;

detecting locations in a time domain of transitions of the clock under test, based on the outputs of the first plurality of clocked latches, each location in the time domain detected comprising one of a plurality of locations in the time domain represented by the outputs of the first plurality of clocked latches;

storing a list of each location in the time domain that a transition of the clock under test occurs; and counting how many times the transition of the clock under test occurs in each location in the time domain; and after the duration of the sampling time window:

determining a jitter of the clock under test based on at least one of the list of each location in the time domain that a transition of the clock under test occurred, or how many times the transition of the clock under test occurred in each location in the time domain.

15. The method of claim 14, wherein the sampling time window comprises a plurality of sub-sampling time windows.

16. The method of claim 14, further comprising, for the duration of the sampling time window, counting how many times the transition of the clock under test occurs in each location in the time domain.

17. The method of claim 16, wherein counting how many times the transition of the clock under test occurs in each location in the time domain comprises counting how many times the transition of the clock under test occurs in a different one of the plurality of locations in the time domain represented by the outputs of the first plurality of clocked latches.

18. The method of claim 16, wherein the sampling time window comprises a plurality of sub-sampling time windows.

19. The method of claim 18, wherein counting how many times the transition of the clock under test occurs in each location in the time domain comprises, for each sub-sampling time window, counting how many times the transition of the clock under test occurs in a different one of the plurality of locations in the time domain represented by the outputs of the first plurality of clocked latches.

* * * * *